US006781138B2

(12) United States Patent
Novak et al.

(10) Patent No.: US 6,781,138 B2
(45) Date of Patent: Aug. 24, 2004

(54) POSITIONING STAGE WITH STATIONARY ACTUATORS

(75) Inventors: W. Thomas Novak, Hillsborough, CA (US); Michael Kovalerchik, Castro Valley, CA (US)

(73) Assignee: Nikon Corp., Tokyo (JP)

( * ) Notice: Subject to any disclaimer, the term of this patent is extended or adjusted under 35 U.S.C. 154(b) by 0 days.

(21) Appl. No.: 09/866,838

(22) Filed: May 30, 2001

(65) Prior Publication Data

US 2002/0179850 A1 Dec. 5, 2002

(51) Int. Cl.⁷ .................................................. G21K 5/10
(52) U.S. Cl. .............................. 250/442.11; 74/490.09; 310/12
(58) Field of Search ........................... 250/442.11, 310; 310/12; 74/490.09

(56) References Cited

U.S. PATENT DOCUMENTS

| 4,409,860 A | * | 10/1983 | Moriyama et al. ....... 74/490.09 |
| 4,667,139 A | | 5/1987 | Hirai et al. |
| 4,684,315 A | | 8/1987 | Sugishima et al. |
| 4,916,340 A | * | 4/1990 | Negishi ...................... 310/12 |
| 5,040,431 A | | 8/1991 | Sakino et al. |
| 5,149,967 A | * | 9/1992 | Otaka ......................... 250/310 |
| 5,475,728 A | | 12/1995 | Smith et al. |
| 5,528,118 A | | 6/1996 | Lee |
| 5,744,924 A | | 4/1998 | Lee |
| 5,812,420 A | | 9/1998 | Takahashi |
| 5,858,587 A | * | 1/1999 | Yamane et al. ............ 430/22 |
| 6,130,490 A | * | 10/2000 | Lee ............................ 310/12 |

* cited by examiner

Primary Examiner—John R. Lee
Assistant Examiner—Paul M. Gurzo
(74) Attorney, Agent, or Firm—Finnegan, Henderson, Farabow, Garrett & Dunner, L.L.P.

(57) ABSTRACT

A positioning stage system for precise and accurate movement of an article in an electron beam lithography system. The positioning stage system includes a support platform for supporting the article, an X-direction linear motor coupled to an X-member, a Y-direction linear motor coupled a Y-member, and a slide attached to the support platform and slidably engaged to the X-member and the Y-member. The X-member and Y-member, upon actuation of the X-direction and Y-direction linear motors, cause the support platform to move in an X-direction and a Y-direction, respectively.

36 Claims, 5 Drawing Sheets

POSITIONING STAGE WITH STATIONARY ACTUATORS

BACKGROUND OF THE INVENTION

1. Field of Invention

The invention relates to a stage for supporting, moving and positioning articles in an xy plane. More particularly, the invention relates to a stage used for supporting and positioning articles in an xy plane in an electron beam lithography system.

2. Description of the Related Art

Many devices such as reticles, semiconductor circuits and liquid crystal displays are fabricated using lithographic equipment, such as an electron beam lithography system. In the fabrication of circuits and/or liquid crystal displays, a article must be accurately and precisely positioned under the optics of a lithographic system. Such positioning is necessary to ensure accurate alignment of the microscopic features being formed in a new layer with other microscopic features in the layers previously formed on the article during the fabrication process. Also, the formed microscopic features on one article must be repeated on other articles in a repetitive process operation.

Complex systems have been developed to position an article, such as positioning a wafer substrate or a reticle, beneath lithographic optics. A step and repeat system often uses an xy positioning system to position the article on a positioning stage beneath the lithographic equipment, expose a portion of the article to a pattern of light or charged particles generated by the lithographic equipment, and reposition the article at another location to again expose the article to the pattern of light or charged particles.

Electron beam lithography is used in the production of high quality patterns. The electron beam passes through magnetic or electrostatic lenses and deflectors capable of directing and focusing the beam onto a wafer or article (reticle) disposed upon a positional stage. An electron beam projection system typically includes an electron beam source, a deflecting system for deflecting the electron beam in a predetermined pattern, and magnetic projection lenses for focusing the electron beam.

During electron beam lithography articles are typically supported and positioned in the xy plane using linear motors that have magnetic assemblies. The xy stages also include an X-guide assembly and a Y-guide assembly that position the article upon actuation of the linear motors. As the guides move during the positioning of the wafer, the magnetic assemblies of the motors as well as magnetic permeable materials associated with the guide assemblies move. As a result, the shifting magnetic fields created by the movement of the magnet assemblies and other magnetic materials interfere with the accurate positioning of the electron beam.

Conventional positioning stages do not shield the electron beam from the shifting magnetic fields created by the moving motors or other moving magnetic permeable components. If not accounted for, the shifting magnetic fields may interact with the electron beam and cause misalignment of the pattern on the article. Thus, it is desirable to provide a positioning stage which minimizes the interaction of the magnetic fields produced by the operation of the stage with the electron beam while exposing the wafer or article. It is also desirable to provide a positioning stage that minimizes vibrations caused by the actuation of the linear motors and movement of the guide assemblies.

SUMMARY OF THE INVENTION

This provides a positioning stage system which minimizes the affect of magnetic fields generated by the motors and other moving magnetic permeable components of the positioning stage system on the operating performance of a lithography system. The positioning stage system includes a support platform, an X-direction linear motor and a Y-direction linear motor, an X-member coupled to the X-direction linear motor and to the support platform to move the support platform in an X-direction along a Y-member, wherein the Y-member is coupled to the Y-direction linear motor and to the support platform to move the support platform in a Y-direction along the X-member, and a slide attached to the support platform and slidably engaged with the X-member and the Y-member. The positioning stage system may further include an interferometer to access the coordinate positioning of the support platform, X-member, Y-member, or any combination thereof.

The slide contains an opening adapted to slidably receive the X-member. The slide is also in slidable engagement with the Y-member. The dimensional area in which the slide can move in the X and Y directions is the interior region of the positioning stage system. Preferably, much of the support platform, slide, X-member, and Y-member will be constructed of non-magnetic materials. The non-magnetic materials may include materials selected from ceramics, plastics, carbon fiber, and combinations thereof.

The X-direction linear motor may include a magnet track that is preferably attached to a frame, and a coil member that is preferably attached to the X-member. The Y-direction linear motor may include a magnet track that is preferably attached to a frame, and a coil member that is preferably attached to the Y-member. Preferably, the Y-direction linear motor is disposed in the peripheral region, which is a dimensional area outside the interior region of the positioning stage system.

The positioning stage system may further include a reaction force canceling system for reducing reaction forces produced by the linear motors and/or by the movement of the X-member or the Y-member. Preferably, the reaction force canceling system contains a counter-mass device attached to a frame and disposed at a location coinciding with the center of gravity of the positioning stage system.

The positioning stage system may further include a guide member extending in the Y-direction. Preferably, the guide member is disposed between the support platform and the Y-direction linear motor. It is also preferred that the Y-member contains an end portion with an opening, the guide member extending through the opening of the Y-member. More preferably, the Y-member contains two end portions each with an opening and the guide member contains two generally parallel shafts each extending through one of the openings.

The invention is also directed to an electron beam lithography system that uses the positioning stage system to position an article in an xy plane. The electron beam lithography system includes an electron beam source for generating a beam of electrons, electron beam lenses operable to focus the electron beam onto a surface of an article, deflectors operable to direct the electron beam to specific positions on the article, and the positioning stage system for supporting and positioning the article in an xy plane.

The invention is also directed to a method of moving and positioning an article in an xy plane using the positioning stage system. An article is placed on a support platform, wherein the support platform is attached to a slide that is slidably engaged with an X-member and a Y-member. An X-direction linear motor is actuated, wherein the X-direction linear motor is coupled to the X-member to position the support platform in an X-direction. Preferably, the article is not being exposed as the support platform is moved in the X-direction. A Y-direction linear motor is then actuated, wherein the Y-direction linear motor is coupled to the Y-member to position the support platform in a Y-direction as the article is exposed.

BRIEF DESCRIPTION OF THE DRAWINGS

The invention will be better understood by reference to the Detailed Description of the Invention when taken together with the attached drawings, wherein.

DETAILED DESCRIPTION OF THE INVENTION

Figure 1:
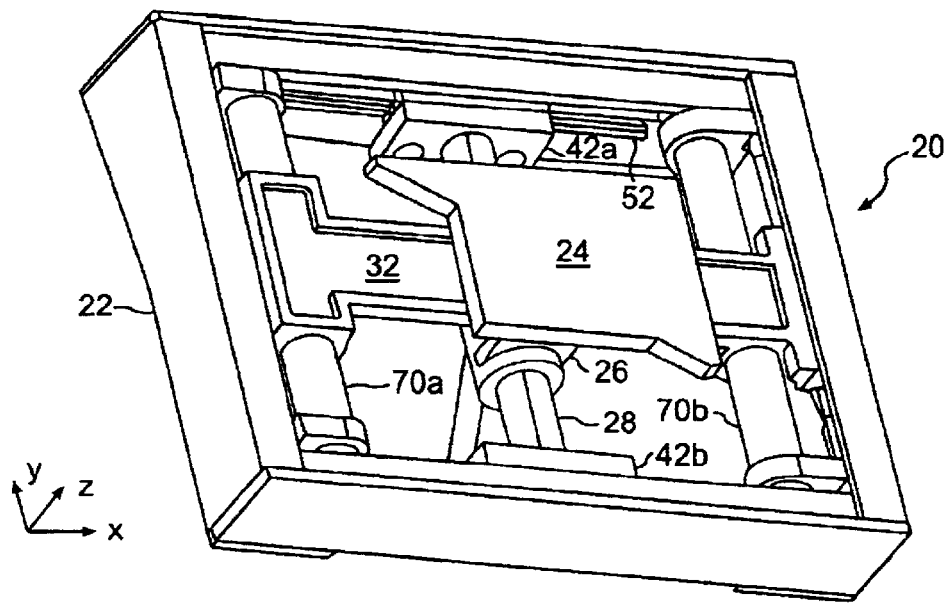
FIG. 1 shows a perspective view of a positioning stage.

Electron beam lithography is one type of lithography system which uses an electron beam to expose an article. The electron beam is very sensitive to magnetic fields, which may effect the exposure performance of the beam. For this reason the movement of magnetic permeable materials during exposure needs to be minimized. Most if not all of the present positional stages contain magnetic permeable components that move during exposure. Of primary concern is the movement of the magnetic assemblies that position the article to the desired coordinate positions. Other magnetic materials used in the stage such as bearings, support members, or magnetic shielding may also effect exposure performance and should be taken into account when calibrating the positioning system. As these magnetic materials move, the corresponding magnetic fields associated with these materials shift. It is this shifting of the magnetic fields which can effect the performance of the electron beam and hence the exposure performance of the system.

The positioning stage of the invention provides a simple, effective and reliable method to control and align articles to be supported, moved and positioned in the xy plane with minimal interaction of magnetic fields produced by the linear motors and other magnetic permeable components. The positioning stage can be used to position an article in an xy plane in any type of lithography system. In particular, the positioning stage has many advantages if used in an electron beam lithography system.

The positional stage of the invention is designed to minimize the movement of these magnetic components during the exposure of the article. In one embodiment, the support platform is moved in the X-direction while the electron beam is deflected away or shielded from the article. One method of shielding the article from the electron beam is to use a blanking device that turns off the beam. Alternatively, a shutter device could be placed between the beam and the article to block the beam. As the support platform moves with the X-member, the electromagnetic coils associated with the X-direction linear motors also move. However, because the article is not being exposed during this time, the movement of the electromagnetic coils and/or any other magnetic materials have no effect on exposure performance. Also, because the article is not exposed by the electron beam as the stage is moved in the X-direction, low precision bearings not designed for fine and smooth movement may be used to facilitate positioning of the stage in the X-direction.

The support platform is then moved in the Y-direction while the article is exposed to the electron beam. Because most, if not all, of the support platform and the Y-member is constructed from non-magnetic materials, there is little, if any, movement of magnetic permeable materials during the exposure of the article. The electromagnetic coils associated with the Y-direction linear motors are preferably disposed in a location away from the stage and the focused electron beam. Also, magnetic shielding about the Y-magnetic assembly can be used to further minimize the effects from shifting magnetic fields from the moving electromagnetic coils. Although any type of bearings may be used to facilitate movement of the stage in the Y-direction, it is preferred that high-precision bearings designed for fine and smooth movement be used.

Vibrations caused by the movement of heavy and bulky components during exposure of the article can also have a negative affect on the exposure performance of the system. The positional stage is designed to minimize the amount of potential vibrations caused by the movement of such components during exposure. For example, most stages utilize heavy magnetic tracks that move in the xy plane as the support platform moves in the xy plane.

It is to be understood that the directional terms X and Y used to describe members, linear motors, and direction in the specification and claims are interchangeable. The directional terms as used coincide with the coordinate system shown in the FIGS. 1–6 which are used to aid in the description of the invention. Therefore, if the coordinate system in the figures is reversed the components will have X and Y terms that are opposite to those described.

The positioning stage system contains some components disposed in an interior region and some components disposed in a peripheral region. The interior region is defined by the dimensional area of the movement in the xy plane of the slide that is slidably engaged to the X- and Y-members. The peripheral region is defined as the dimensional area outside of the interior region. Preferably, the Y-direction linear motor is disposed in the peripheral region. More preferably, both the X-direction and Y-direction linear motors are disposed in the peripheral region. The X-member extends in the Y-direction through the interior region, and causes the slide to move in an X-direction within the interior region. The Y body member extends in the X-direction through the interior region, and causes the slide to move in the Y-direction within the interior region.

The X-direction linear motor includes coil members mounted to at least one end of the X-member, and at least one magnet track coupled to the coil members. In the preferred embodiment, the X-direction linear motor will have at least two sets of coil members and magnet tracks.

The coil members will be attached to each end of the X-member. Also, it is preferred that the magnet tracks be attached to opposite ends of the stage frame. The coil members and the magnet track of the X-direction linear motor cooperate to exert a force in the X-direction on the X-member upon actuation to move and position the support platform in the X-direction.

Similarly, the Y-direction linear motor includes coil members attached to at least one end of the Y-member, and at least one magnet track coupled to the coil members. In the preferred embodiment, the Y-direction linear motor will have at least two sets of coil members and magnet tracks. The coil members will be attached to each end of the Y-member. Also, it is preferred that the magnet tracks be attached to opposite ends of the stage frame. The coil members and the magnet track of the Y-direction linear motor cooperate to exert a force in the Y-direction on the Y-member upon actuation to move and position the support platform in the Y-direction.

The term coupled is used to define the structural relationship between two or more components of the positioning stage system. The term coupled is not to be limited to two or more components in direct contact with one another. Instead, the term is used to characterize the dynamic relationship of one component to another. For example, one component is coupled to another component if movement of the one component coincides with or directs the movement of another component.

The positioning stage system may further include at least one guide member attached to the frame and extending in the Y-direction to guide movement of the Y-member in the Y-direction upon actuation of the Y-direction linear motor. Preferably, the guide may include two generally parallel stationary shafts extending through two channels or openings defined in end portions of the Y-member. The guide member is preferably disposed in the peripheral space of the frame.

The positioning stage system further includes a slide attached to the support platform, and slidably engaged to the X-member and the Y-member. The slide includes an opening or channel adapted to slidably receive the guide member therethrough and a slide block for slidable engagement with a slide rail of the Y-member. The slide, X-member, and Y-member are configured to substantially support the weight of the support platform.

An interferometer may be provided to measure and determine the position and orientation of the support platform. The interferometer may send signals indicative of the position and orientation of the support platform to a feedback control loop that determines and supplies an appropriate amount of current to the coil members of the X-direction and Y-direction linear motors.

Where the stage is operated at high speeds and/or high accelerations, a mechanism to cancel the reaction forces is preferably provided. Such cancellation mechanism may be achieved by providing any suitable counter-mass device or reaction force cancellation device near the center of gravity or center of mass of the stage. The counter-mass device generally includes one or more counter masses and a linear motor disposed within a housing.

Figure 2:
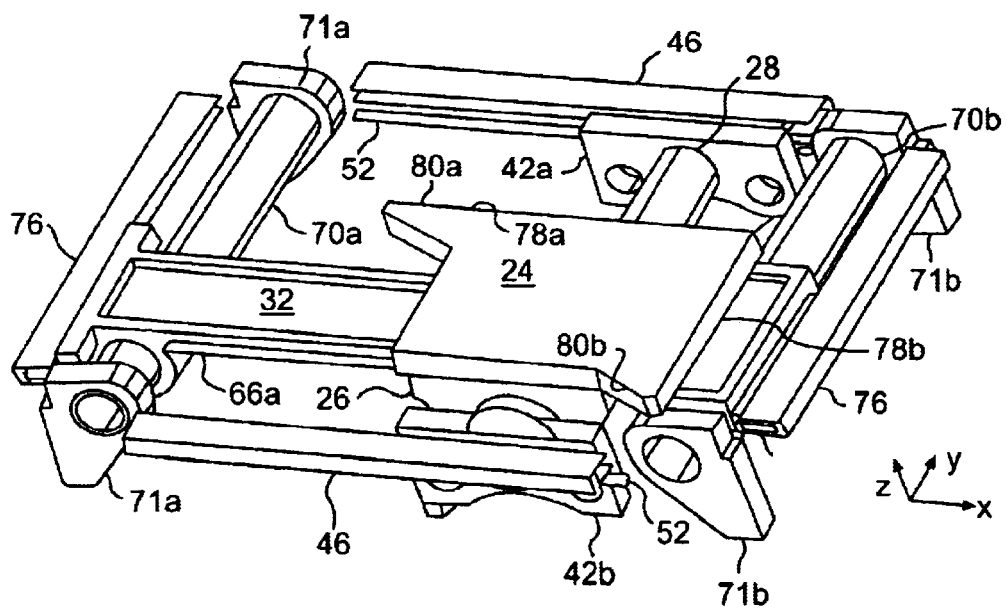
FIG. 2 shows a perspective view of the positioning stage without a frame.

As shown in the perspective views of FIGS. 1 and 2, the positioning stage system 20 includes a frame 22 and a support platform 24 attached to a slide 26. Slide 26 and support platform 24 moves in the X-direction along Y-member 32 as the X-linear motors are actuated. The support platform 24 moves in the Y-direction along X-member 28 as the Y-direction linear motors are actuated. The frame 22 may provide a plurality of openings for providing access to the various components of the positioning stage system 20, for example, wiring access to the linear motors.

The support platform 24 is adapted to support one or more articles such as wafers or reticles to be moved and positioned in the xy plane. The articles may be secured to the support platform 24 by clamps and/or by any suitable securing mechanisms (not shown). The dimensions of the stage support platform 24 are scalable to those desired, depending upon the specific application.

Figure 3:
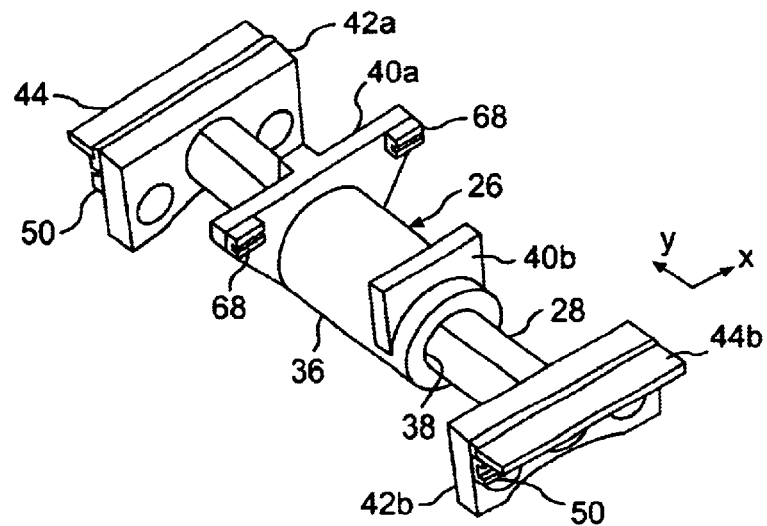
FIG. 3 shows a perspective view of the slide engaged with the X-member.
Figure 4:
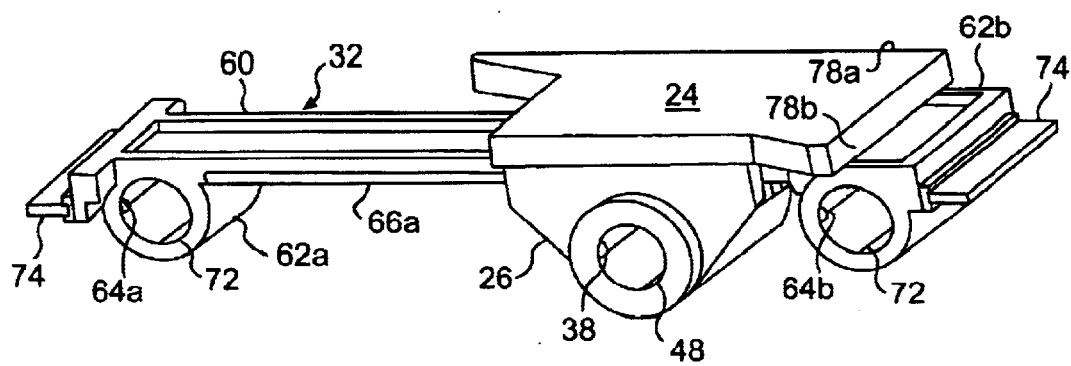
FIG. 4 shows a perspective view of the slide engaged with the Y-member.

The movement and positioning of the support platform 24 at a desired location in the X-direction will now be described with reference to FIGS. 1–4. FIGS. 3 and 4 shows a perspective view of the slide 26 and the X-member 28. The slide 26 includes a body portion 36 defining an opening or channel 38 and support members 40*a*, 40*b* extending from the body portion 36. The support platform 24 is attached to the slide support members 40*a*, 40*b* and is supported thereby. Preferably, the support platform 24 is attached at two locations to the slider support member 40*a* and at one location to the slider support member 40*b*.

An opening 38 in the slide 26 is configured to receive X-member 28 therethrough. A bearing 48 is disposed within the opening 38 of slide 26. Bearing 48 facilitates movement of slide 26 along the X-member 28 in the Y-direction. Bearing 48 may be any suitable bearing, such as an air bearing or a ball or roller bearing. Bearings reduce the friction and provide smooth movement between the moving components. Preferably, bearing 48 is a high precision, fine movement gas bearing that facilitates movement of slide 26 over X-member 28 as stage platform 24 moves in the Y-direction during exposure of the article.

Air or gas bearings support the mass of support platform 24 and Y-member 32 by using pressurized air, nitrogen, or other gases. Air or gas bearings may use hoses (not shown) to deliver air or gas from an air or gas source to the interior of the opening 38 via ports (not shown). The air or gas thus provides an air cushion between opening 38 and X-member 28.

X-member 28 is attached at its two ends to movable end plates 42*a*, 42*b* that are coupled to the X-direction linear motors. In the preferred embodiment, each X-direction linear motors includes a coil member 44 attached to one of the movable end plates 42*a*, 42*b* and a cooperating stationary magnet track 46 attached to the frame 22. The magnet track 46 includes a set of magnets disposed along the X-direction for at least the desired length of travel of the support platform 24 in the X-direction. The magnets of the magnet track 46 form a slot such that the coil member 44 is receivable and slidable therein. An example of a type of suitable linear motor for use in the stage system 20 of the invention is described in copending U.S. application Ser. No. 09/054,766, filed Apr. 3, 1998, the entirety of which is incorporated herein by reference.

Preferably, the magnet track 46 substantially extends the length of the frame 22 in the X-direction. Linear motors using a magnet track and a coil member are actuated by the application of an appropriate current to the coil member. It should be noted that other linear motors, such as ultrasonic and air cylinder motors, can also be used with the invention. By actuating the X-direction linear motors a force in the X direction is exerted on the movable end plates 42*a*, 42*b*. The force in the X-direction is transferred to the support platform 24 via X-member 28 and slide 26 to position support platform 24 at the desired X-coordinate.

Movable end plates 42a, 42b have attached thereto sliding blocks 50 that cooperate with rails, guides or tracks 52 (shown in FIGS. 1 and 2) attached to frame 22 to facilitate the sliding of movable end plates 42a, 42b in the X-direction. Preferably, rails 52 extend in the X-direction for at least the desired length of travel of the support platform 24 and for approximately the length of magnet track 46. Sliding blocks 50 and rails 52 may be any suitable sliding block and rail system, such as those utilizing rolling balls. An example of a suitable sliding block and rail system is the type SSR LM guide, commercially available through THK America Inc., Schaumburg, Ill.

Figure 5:
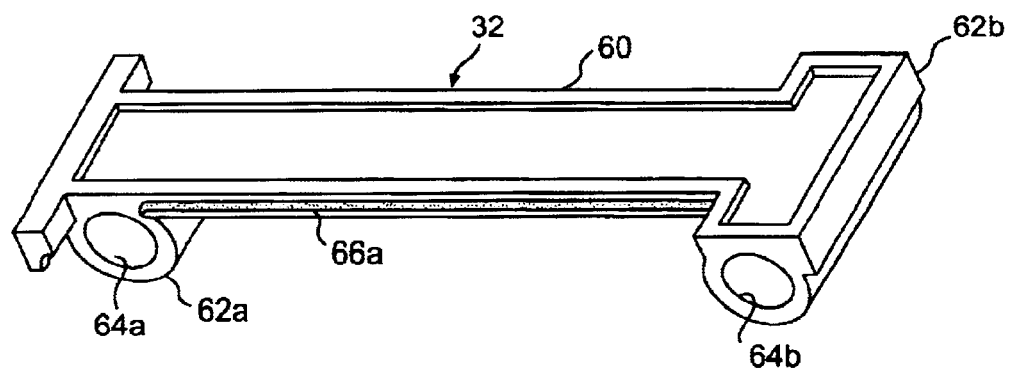
FIG. 5 shows a perspective view of the Y-member.
Figure 6:
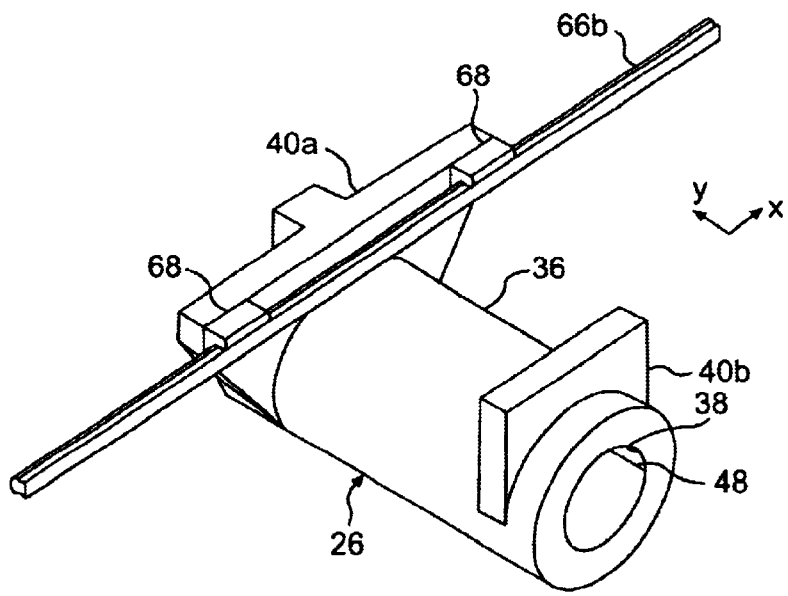
FIG. 6 shows a perspective view of the slider engaged with a rail of the Y-member.

Slide 26 is also coupled to Y-member 32 and is slidable along Y-member 32 in the X-direction upon the actuation of the X-direction linear motors. FIGS. 4 and 5 show perspective views of the Y-member 32. To facilitate the sliding movement of slide 26 along Y-member 32 in the X-direction, rails 66a, 66b are attached on the sides of Y-member 32. In addition, sliding blocks 68 engagable and cooperable with rails 66a, 66b are attached to support members 40a, 40b of slide 26. FIG. 6 illustrates rail 66b engaged to and cooperating with sliding blocks 68 attached to support member 40a of slide 26. Although not shown, additional sliding blocks 68 may be attached to the support member 40b for engagement and cooperation with rail 66a of Y-member 32. Sliding blocks 68 and rails 66 may be any suitable sliding block and rail system similar to those described above.

Movement and positioning of support platform 24 at a desired Y-coordinate will now be described. Y-member 32 includes a body portion 60 and two end portions 62a, 62b each defining an opening or channel 64a, 64b extending in the Y-direction. The movable member end portion openings 64a, 64b are configured to receive stationary shafts 70a, 70b (shown in FIGS. 1 and 2) therethrough. Stationary shafts 70a, 70b are attached to frame 22 via shaft retainers 71a, 71b. Stationary shafts 70a, 70b extend in the Y-direction such that Y-member 32 is slidable along stationary shafts 70a, 70b in the Y-direction. Bearings 72 are provided in each of the openings 64a, 64b of the end portions 62a, 62b of Y-member 32. Bearings 72 facilitate the sliding of Y-member 32 along stationary shafts 70a, 70b in the Y-direction. Bearings 72 may be any suitable bearing, such as an air bearing or a ball or roller bearing. Preferably, bearings 72 are high precision, fine movement gas bearings that facilitates movement of Y-member 32 over guide members 70a, 70b as the stage platform 24 moves in the Y-direction during beam exposure of the article.

The end portions 62a, 62b of Y-member 32 are coupled to the Y-direction linear motors. In the preferred embodiment, each of the linear motors includes a coil member 74 attached to a corresponding end of the Y-member 32 and a cooperating stationary magnet track 76 (shown in FIG. 2) attached to frame 22. Magnet track 76 includes a set of magnets disposed along the Y-direction for at least the desired length of travel in the Y-direction of support platform 24. Preferably, the magnet track 76 substantially extends the length of frame 22 in the Y-direction. Linear motors employing a magnet track and a coil member are actuated by the application of an appropriate current to coil member 74. Actuation of the Y-direction linear motors result in a force in the Y-direction that is exerted on the end portions 62a, 62b of Y-member 32. The force in the Y-direction is transferred to support platform 24 via Y-member 32 and slide 26 to thereby move and position support platform 24 at the desired Y-coordinate.

Although X-member 28 and stationary shafts 70a, 70b are shown to have a circular cross-section, any suitable cross-sectional shape, e.g., ellipsoid or rectangular, may be used. Accordingly, the corresponding opening 38 of slide 26 and openings 64a, 64b of Y-member 32 would have similar corresponding cross-sectional shapes.

Desirably, one of the stationary shafts 70a, 70b provides a relatively small clearance to the corresponding opening 64a, 64b of Y-member 32 while the other of the stationary shafts 70a, 70b provides a relatively large clearance to the other of the openings 64a, 64b. Similarly, the clearance between X-member 28 and opening 38 through slide 26 is preferably relatively large such that X-member 28 need not be perfectly parallel with stationary shafts 70a, 70b or with opening 38 defined by slide 26. Although a misalignment between X-member 28 and shafts 70a, 70b may cause an over-constraint condition, the fact that body 60 and bearings 72 are not perfectly rigid some misalignment can be tolerated. Over-constraint is a term used to describe a condition when there are too many constraints or components determining the location of an object. Over-constraint may cause component distortion or binding of the bearings.

In one embodiment, one of the shafts 70a, 70b could be mounted to the body portion 60 using flexures. Flexures permit movement of certain components in one direction and restrict movement of the same components in a second direction.

If bearings 72 are air bearings, then it would be expected that a non-parallel alignment between openings 64a, 64b stationary shafts 70a, 70b would cause excessive air leakage. To minimize air leakage sleeve bearing 72 can be mounted to body 60 using a structure that is compliant in the X-direction, yet rigid in the Y-direction and Z-direction. This will allow for small misalignment of rods 70a and 70b and allow for thermal expansion or mismatch of component expansion.

The provision of two generally parallel X-direction linear motors facilitates in reducing or preventing vibration of the support platform 24 as well as reducing or preventing the creation of a moment about the axis of the linear motors. In particular, the provision of two generally parallel X-direction linear motors facilitates in moving X-member 28, slide 26 and support platform 24 through the center of gravity or through a location near the center of gravity in the Y-direction. This is accomplished by adjusting the currents to the coils 44a and 44b independently so that the z-axis moments about the center of gravity due to each motor is cancelled (equal and opposite moments).

Similarly, the provision of two generally parallel Y-direction linear motors facilitates in reducing or preventing vibration of the support platform 24 as well as in reducing or preventing the creation of a moment about the y-axis of the linear motors. In particular, the provision of two generally parallel Y-direction linear motors facilitates in moving Y-member 32, slide 26 and support platform 24 through the center of gravity or through a location near the center of gravity in the X-direction by adjusting the currents in the Y motors independently.

Further, providing linear motors with stationary magnet tracks and movable coil members greatly decreases the mass that must be driven by the linear motors. A smaller driven mass thus allows better control and faster positioning of the article supported by the support platform 24.

Various devices such as an interferometer may be utilized to measure and determine the orientation and position of support platform 24. The interferometer utilizes signals reflected from mirrors provided on faces 78a, 78b of support platform 24 to measure and determine the orientation and position of support platform 24. Support platform 24 preferably includes extensions 80a, 80b that provide increased stroke or length of the mirrored faces 78a, 78b for maintaining the mirrors faces 78a, 78b within sight of the interferometer for providing the reflected signals to the interferometer.

A feedback controller may be provided to determine and apply different levels of current to the coils of each linear motors in response to the orientation and position of support platform 24. The interferometer or other suitable position determining device may send output signals indicative of the orientation and position of support platform 24 to the feedback controller. The X-direction linear motors may be differentially driven to prevent and overcome any tendency of support platform 24 to yaw, i.e. rotate about the vertical z-axis. Similarly, the Y-direction linear motors may also be differentially driven to prevent and overcome any tendency of support platform 24 to yaw, i.e. rotate about the vertical z-axis. Such differential driving of the X-direction linear motors and the differential driving of the Y-direction linear motors compensates for the tendency of the support platform 24 to pivot, i.e. move faster on one side versus the other. This tendency of the support platform 24 to pivot may be caused by the non-ideal response of the linear motors to the applied currents and/or the center of gravity of the stage system 20 not being centrally located within frame 22 when support platform 24 is not centrally located within the frame 22.

The air-bearing structures associated with X-member 28 and stationary shafts 70a, 70b may also provide some anti-yaw effect. However, the differential driving of the linear motors provides higher anti-yaw performance than the air bearings alone. Thus, any tendency of support platform 24 to yaw is minimized by the differential drive control.

Depending upon the operating accelerations and velocities of the stage system 20, one or more counter-mass devices may be provided to facilitate the cancellation of reaction forces exerted on frame 22 by support platform 24 when the support platform 24 is subjected to high speeds and/or high accelerations in the X-direction and/or Y-direction by the linear motors. However, if the support platform 24 is driven at relatively low velocities and low accelerations, the inclusion of a counter-mass device may be unnecessary. If a counter-mass device is provided, the counter-mass device is preferably attached to the frame 22 and preferably disposed at a location coinciding with the center of gravity of the stage 20, such as below and in the peripheral region. Any suitable counter-mass device may be utilized.

Support platform 24, slide 26, X-member 28 and the body portion 60 of Y-member 32 are all disposed and movable within the interior region. Stationary shafts 70a, 70b may be in the peripheral space or in the interior space. Preferably, stationary shafts 70a, 70b are within the interior region. The linear motors include stationary magnet tracks disposed in the peripheral region. This placement minimizes the magnitude of the magnetic fields generated by the linear motors that may interfere the electron beam and thus adversely affect the performance of the electron beam lithography system 100. Thus, the stage system 20 of the invention is particularly suitable for use in an electron beam lithography system as most, if not all, of the magnetic fields generated by the stage system 20 are centralized in the peripheral region.

The stage system 20, including any counterbalancing devices, may include any suitable material such as steel, aluminum, ceramics, plastics, depending upon factors such as the requirements of the specific application, weight, and cost. For electron beam lithography applications, all components of the stage system 20 disposed and movable within the interior region are constructed mostly of non-conducting materials. Such materials may include ceramics, plastics, and carbon fibers. The components that may generate magnetic fields, including the X-direction and Y-direction linear motors are preferably disposed in the peripheral region. Limiting the materials of the interior region components to non-conducting materials minimizes their contribution to the generation of magnetic fields in the interior region.

Figure 7:
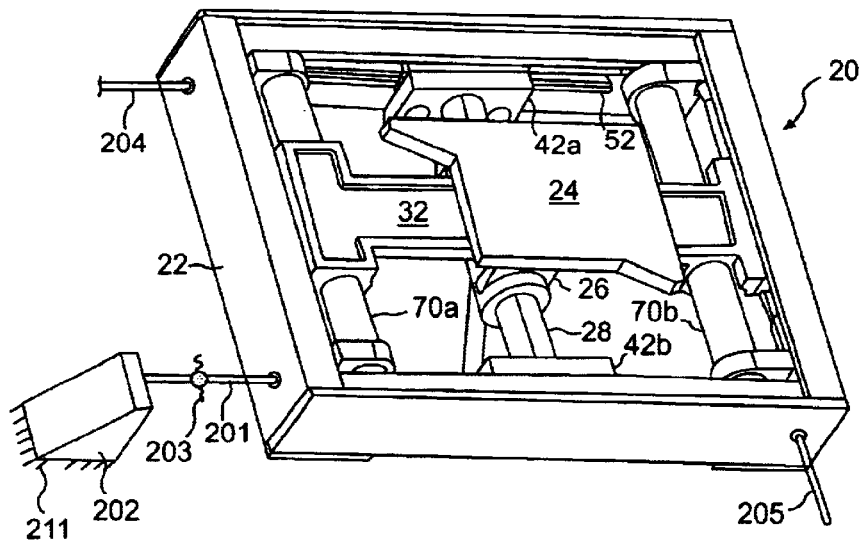
FIG. 7 shows a perspective view of a reaction force canceling system.

A reaction force canceling technique using a reaction frame is shown in FIG. 7. Frame 22 is flexibly attached to the main system structure (not shown). This allows for some small movement of the frame and stage, so that reactive forces applied from the magnet tracks 46, 76 of the stage motor, which cause small movements of the stage frame 22, do not transmit through the frame 22 directly the main system structure. Frame 22 is held in place partly by rods 201, which in turn are connected to block 202. Block 202 is connected to ground 211. A seal or flexible bellows 203 is used to prevent leakage around rod 201. Additional rods 204, 205 are used to secure the frame 22. Rods 204, 205 are also attached to ground blocks (not shown) similar to 202. The reaction forces from the motors are thus grounded resulting in minimal disturbance to the main system structure.

Figure 8:
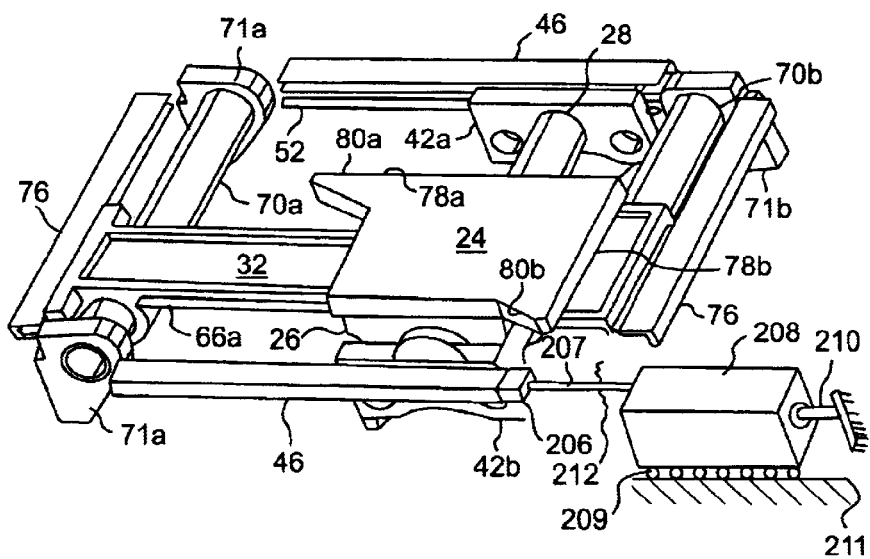
FIG. 8 shows a perspective view of a countermass device.

A mass counter balance or countermass device is shown in FIG. 8. In this embodiment, magnet track 46 is flexibly mounted using a flexure or other type of bearing to frame 22, allowing for a small movement of the magnet track relative to frame 22. The magnet track is connected to a countermass 208, through rod 207 and attachment block 206. Countermass 208 is attached to ground 211 using a bearing 209. If the countermass is outside the stage vacuum chamber (not shown), then seal 212 is used to prevent leakage of air into the vacuum chamber. A small motor 210 or spring can be used to keep the countermass within its normal operating range. A similar countermass is provided for each of the magnet tracks 46, 76 so that substantially all reaction forces are absorbed and reduced. The countermass system provides superior reaction force canceling compared to the reaction frame, but at a higher cost, size and complexity.

Figure 9:
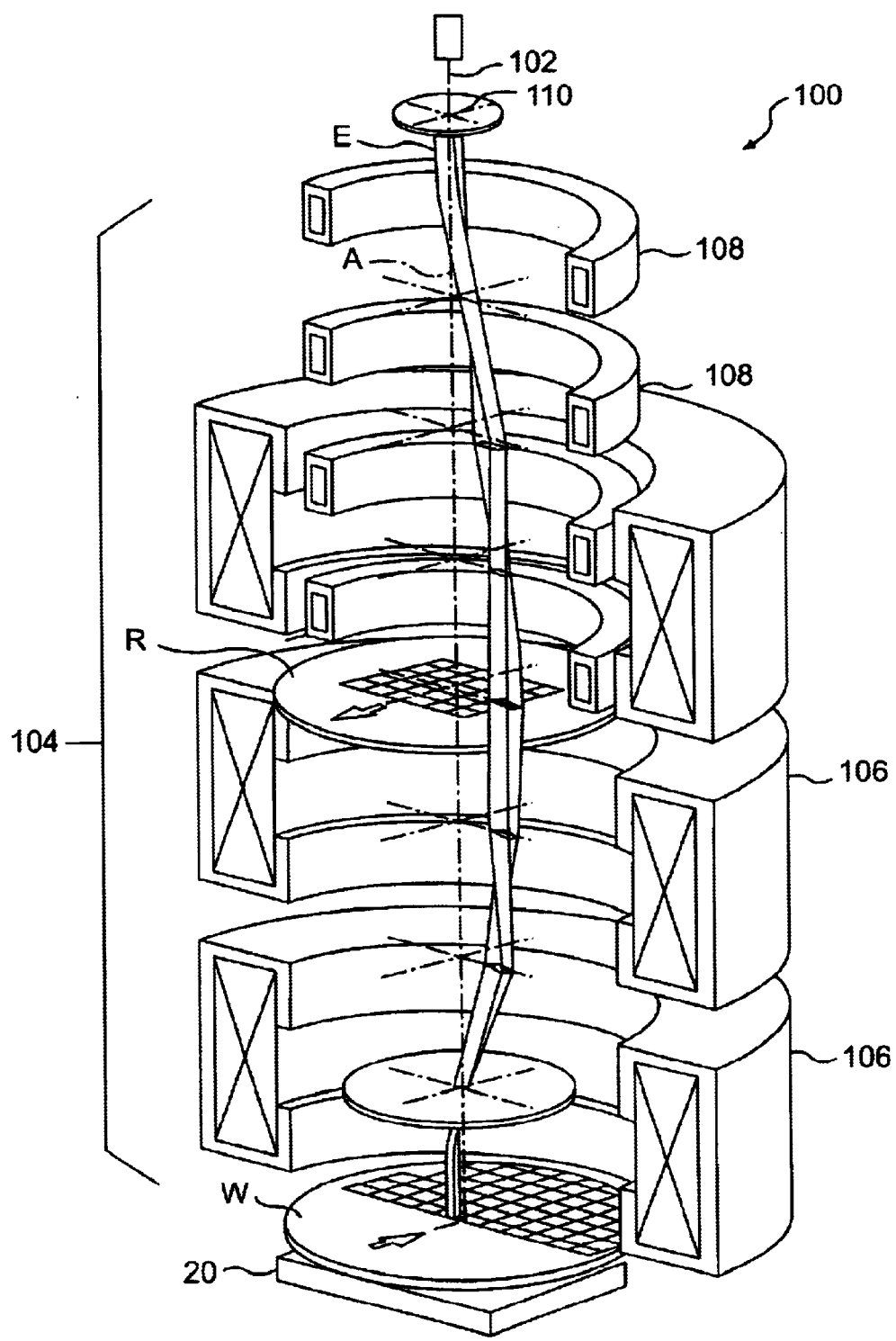
FIG. 9 shows a cut-away schematic view of an electron beam lithography system.

FIG. 9 is a partially cut-away schematic illustration of an electron beam lithography system 100 in which the stage system 20 of the invention may be utilized. The electron beam lithography system 100 generally includes an electron beam source 102, an electron beam column 104, and a stage 20 of the invention for positioning an article such as a semiconductor wafer W relative to the electron beam column 104 to provide accurate alignment of the wafer W relative to the optical system for processing. The electron beam column 104 generally includes a vertical arrangement of separate stages including, for example, a condenser lens, a projection lens and a deflector system. The electron beam system 100 operates under vacuum conditions to prevent gas molecules from perturbing the electron beam E.

The electron beam source (gun) 102 emits a diverging beam of electrons downwardly along axis A through an illuminating aperture 110. After passing through the aperture 110, the beam E is collimated (rendered parallel) by a conventional magnetic lens acting as a condenser (not shown). The electron beam E may be, for example, be gaussian in profile, have a simple geometric shape such as a rectangle or triangle, or an element of a repetitive pattern to be printed on the wafer W. The electron beam E may also pass through a nitride that imparts the final wafer pattern on it. The electron beam column 104 includes magnetic or electrostatic lenses 106 operable to focus the beam E onto a surface of the wafer W and deflectors 108 for directing the beam to specific positions on the wafer W where photoresist placed on an upper surface of the wafer W is to be exposed.

The lenses 106 and deflectors 108 are aligned along the central longitudinal axis A of the electron beam column 104. For clarity, parts of the system are removed to show detail. A reticle (mask) R having a circuit pattern formed therein is placed between the lenses 106 and deflectors 108. The reticle R represents a pattern on a layer of an integrated circuit. The electron beam E will step in sequence through portions of the reticle R, the totality of which represents a pattern of the integrated circuit. As the beam E passes through the reticle R, the beam is patterned with the information contained in the reticle R.

It is to be understood that the electron beam system may be different from the one shown herein without departing from the scope of the invention. The general reference to the electron beam projection system 100 shown in FIG. 9 is merely for illustrating an embodiment of an environment in which the concept of the stage 20 of the invention may be advantageously adopted. Further details of the components of an electron beam projection system may be referenced from U.S. Pat. No. 4,859,856, for example, the entirety of which is incorporated by reference herein.

The positioning stage of the invention provides an accurate and reliable yet simple, effective, and space-efficient method to control and align articles, such as wafers and/or reticles, to be supported, moved and positioned. It also reduces the effect of magnetic fields generated by the magnet tracks on the electron beam in an electron beam lithography system.

It is to be understood that although the invention is described in terms moving and positioning reticles in an electron beam lithography system, the invention can be used in any automated transport application.

While specific embodiments of the invention have been described and illustrated, it will be appreciated that modifications can be made to these embodiments without departing from the spirit of the invention. Thus, the invention is not intended to be limited to the embodiments shown, but is to be accorded the widest scope consistent with the principles and features disclosed herein and defined by the following claims.

What is claimed is:

1. A positioning stage system, comprising:
    a support platform;
    an X-direction linear motor and a Y-direction linear motor;
    an X-member coupled to the X-direction linear motor and to the support platform to move the support platform in an X-direction along a Y-member, wherein the Y-member is coupled to the Y-direction linear motor and to the support platform to move the support platform in a Y-direction along the X-member; and
    a slide attached to the support platform and slidably engaged with the X-member and the Y-member, wherein the slide, X-member, and Y-member are configured to substantially support the weight of the support platform,
    characterized in that the support platform is configured to slide directly on the X-member in the Y-direction and configured to slide directly on the Y-member in the X-direction.

2. The positioning stage system of claim 1, wherein the X-direction linear motor comprises a magnet track and a coil member.

3. The positioning stage system of claim 2, wherein the magnet track is stationary and attached to a frame.

4. The positioning stage system of claim 3, wherein the coil member is attached to the X-member and slidably engaged with the stationary track.

5. The positioning stage system of claim 1, wherein the Y-direction linear motor comprises a magnet track and a coil member.

6. The positioning stage system of claim 5, wherein the magnet track is stationary and attached to a frame.

7. The positioning stage system of claim 6, wherein the coil member is attached to the Y-member and slidably engaged with the stationary track.

8. The positioning stage system of claim 1, further comprising a reaction force canceling system for reducing reaction forces produced by the linear motors.

9. The positioning stage system of claim 8, wherein the reaction force canceling system comprises one or more rods movably attached to a frame and connected to a grounding block.

10. The positioning stage system of claim 1 further comprising a countermass device.

11. The positioning stage system of claim 1, further comprising a guide member extending in the Y-direction.

12. The positioning stage system of claim 11, wherein the Y-member comprises an end portion with an opening, the guide member extending through the opening of the Y-member.

13. The positioning stage system of claim 11, wherein the Y-member comprises two end portions each with an opening and the guide member comprises two generally parallel shafts each extending through one of the openings.

14. The positioning stage system of claim 11, wherein the guide member is disposed between the support platform and the Y-direction linear motor.

15. The positioning stage system of claim 1, wherein the slide comprises an opening adapted to slidably receive the X-member.

16. The positioning stage system of claim 1, wherein the slide is in slidable engagement with the Y-member.

17. The positioning stage system of claim 1, wherein the support platform, slide, X-member and Y-member comprise non-magnetic materials.

18. The positioning stage system of claim 17, wherein the non-magnetic materials comprise materials selected from the group consisting of ceramics, plastics, carbon fiber, and combinations thereof.

19. The positioning stage system of claim 1, further comprising an interferometer.

20. The positioning stage system of claim 1, wherein the support platform and the slide are disposed in an interior region of the positioning stage system.

21. The positioning stage system of claim 1, wherein the Y-direction linear motor is disposed in a peripheral region of the positioning stage system.

22. An electron beam lithography system, comprising:
    an electron beam source for generating a beam of electrons;
    electron beam lenses operable to focus the beam onto a surface of an article;
    deflectors operable to direct the beam to specific positions on the article; and
    a positioning stage system for supporting and positioning the article, the positioning stage system comprising:

a support platform;

an X-direction linear motor and a Y-direction linear motor;

an X-member coupled to the X-direction linear motor and to the support platform to move the support platform in an X-direction along a Y-member, wherein the Y-member is coupled to the Y-direction linear motor and to the support platform to move the support platform in a Y-direction along the X-member; and a slide attached to the support platform and slidably engaged with the X-member and the Y-member, wherein the slide, X-member, and Y-member are configured to substantially support the weight of the support platform, characterized in that the support platform is configured to slide directly on the X-member in the Y-direction and configured to slide directly on the Y-member in the X-direction.

23. The electron beam lithography system of claim 22, wherein the X-direction linear motor comprises a magnet track attached to a frame and a coil member attached to the X-member and slidably engaged with the magnet track.

24. The electron beam lithography system of claim 22, wherein the Y-direction linear motor comprises a magnet track attached to a frame and a coil member attached to the Y-member and slidably engaged with the magnet track.

25. The electron beam lithography system of claim 22, further comprising a reaction force canceling system for reducing reaction forces produced by the linear motors.

26. The electron beam lithography system of claim 25, wherein the reaction force canceling system comprises one or more rods movably attached to a frame and connected to a grounding block.

27. The electron beam lithography system of claim 22 further comprising a countermass device to allow small movement of a magnet track in relation to a frame.

28. The electron beam lithography system of claim 22, wherein the support platform and the slide are disposed in an interior region of the positioning stage system and the Y-direction linear motor is disposed in a peripheral region of the positioning stage system.

29. The electron beam lithography system of claim 22, further comprising a guide member extending in the Y-direction through an opening in the Y-member.

30. The electron beam lithography system of claim 29, wherein the Y-member comprises two end portions each with an opening and the guide member comprises two generally parallel shafts each extending through one of the openings.

31. The electron beam lithography system of claim 22, wherein the slide comprises an opening adapted to slidably receive the X-member and is in slidable engagement with the Y-member.

32. The electron beam lithography system of claim 22, further comprising an interferometer.

33. A method for moving and positioning an article in an xy plane, comprising:

placing the article on a support platform, wherein the support platform is attached to a slide that is slidably engaged with an X-member and a Y-member, and the slide, X-member, and Y-member are configured to substantially support the weight of the support platform;

actuating an X-direction linear motor, wherein the X-direction linear motor is coupled to the X-member to position the support platform in an X-direction;

actuating a Y-direction linear motor, wherein the Y-direction linear motor is coupled to the Y-member to position the support platform in a Y-direction;

sliding the support platform directly on the X-member in the Y-direction; and sliding the support platform directly on the Y-member in the X-direction.

34. The method of claim 33, wherein the X-direction and Y-direction linear motors comprise magnet tracks and movable coil members.

35. The method of claim 33, wherein actuating the X-direction linear motor to position the support platform in the X-direction occurs as the article is not being exposed.

36. The method of claim 33, wherein actuating the Y-direction linear motor to position the support platform in the Y-direction occurs as the article is being exposed.

* * * * *

UNITED STATES PATENT AND TRADEMARK OFFICE
CERTIFICATE OF CORRECTION

PATENT NO. : 6,781,138 B2
DATED : August 24, 2004
INVENTOR(S) : W. Thomas Novak et al.

It is certified that error appears in the above-identified patent and that said Letters Patent is hereby corrected as shown below:

<u>Title page,</u>
Item [57], ABSTRACT,
Lines 5-6, "coupled a Y-member," should read -- coupled to a Y-member, --.

Signed and Sealed this

Thirtieth Day of November, 2004

JON W. DUDAS
*Director of the United States Patent and Trademark Office*